United States Patent
Shimizu et al.

(10) Patent No.: US 12,128,545 B2
(45) Date of Patent: Oct. 29, 2024

(54) ROBOT

(71) Applicant: KAWASAKI JUKOGYO KABUSHIKI KAISHA, Kobe (JP)

(72) Inventors: Ippei Shimizu, Kobe (JP); Hiroyuki Okada, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 18/024,505

(22) PCT Filed: Aug. 29, 2021

(86) PCT No.: PCT/JP2021/031633
§ 371 (c)(1),
(2) Date: Mar. 3, 2023

(87) PCT Pub. No.: WO2022/050207
PCT Pub. Date: Mar. 10, 2022

(65) Prior Publication Data
US 2023/0321850 A1     Oct. 12, 2023

(30) Foreign Application Priority Data
Sep. 4, 2020   (JP) .................................. 2020-148893

(51) Int. Cl.
*B25J 17/02*     (2006.01)
*B25J 11/00*     (2006.01)

(52) U.S. Cl.
CPC ............ *B25J 11/0095* (2013.01); *B25J 17/02* (2013.01)

(58) Field of Classification Search
CPC ...... B65G 49/07; B65G 47/90; B25J 15/0616; B25J 11/0095
See application file for complete search history.

(56) References Cited

U.S. PATENT DOCUMENTS

| 6,635,516 | B1 * | 10/2003 | Komatsu | ........... H01L 21/68728 438/678 |
| 2016/0332301 | A1 * | 11/2016 | Kesil | .................... B25J 11/0095 |

FOREIGN PATENT DOCUMENTS

| JP | 2003197714 A | * | 7/2003 |
| JP | 2006120861 A | * | 5/2006 |
| KR | 10-2001-0080717 A | | 8/2001 |

* cited by examiner

*Primary Examiner* — Gregory Robert Weber
(74) *Attorney, Agent, or Firm* — XSENSUS LLP

(57) ABSTRACT

A robot is for transferring a substrate. The robot includes an arm, a hand, and a tilter. The arm is movable. The hand is installed to the arm to project from it and holds and transfers the substrate. The tilter tilts an orientation of the hand. The hand includes a holder. The holder contacts the top surface and the bottom surface of the substrate. With the tilter, the holder holds the substrate keeping in contact with the top surface and the bottom surface of the substrate and applying forces to only one of two halves of the substrate bisected.

9 Claims, 8 Drawing Sheets hand insertion direction hand insertion direction
(hand projection direction)
←

ROBOT

CROSS-REFERENCE TO RELATED APPLICATIONS

The present application is based on PCT filing PCT/JP2021/031633, filed Aug. 29, 2021, which claims priority to JP 2020-148893, filed Sep. 4, 2020, the entire contents of each are incorporated herein by reference.

TECHNICAL FIELD

The present disclosure relates to a robot that transfers a substrate, such as a semiconductor wafer and a printed circuit board.

BACKGROUND ART

Conventionally, there has been a known transfer robot that transfers a substrate. PTL 1 discloses a transfer apparatus comprising a transfer robot, which is a robot of this type.

The transfer robot of PTL 1 includes a body and an arm. The arm is installed at the top of the body. The transfer robot transfers the substrate (workpiece) between a cassette (storage apparatus) and various processing apparatuses or the like by extending and retracting the arm. An end effector that holds the substrate is installed to the distal end of the arm.

PRIOR-ART DOCUMENTS

Patent Documents

PTL 1: Japanese Patent Application Publication No. 2006-120861

SUMMARY OF THE INVENTION

Problems to be Solved by the Invention

With the configuration disclosed in PTL 1, generally, the end effector must be inserted deeply into the cassette passing through a space under the substrate when taking out the substrate stored in the cassette for transfer. Therefore, a configuration that allows the substrate to be transferred with a simpler method has been desired.

The present disclosure is made in view of the situation described above, and its purpose is to provide a robot designed to efficiently transfer a substrate.

Means for Solving the Problems

The problem to be solved by the present disclosure is as described above. The means to solve this problem and the effects thereof will be described below.

An aspect of the present disclosure provides a robot with a configuration described below. That is, a robot is for transferring a substrate. The robot includes an arm, a hand, and a tilter. The arm is movable. The hand is installed to the arm to project form it and holds and transfers the substrate. The tilter can tilt an orientation of the hand. The hand comprises a holder. The holder contacts the top surface and the bottom surface of the substrate. With the tilter, the holder holds the substrate keeping in contact with the top surface and the bottom surface of the substrate and applying forces to only one of two halves of the substrate bisected. The term the substrate is "bisected" shall mean that the substrate is hypothetically divided into two equal portions by a plane parallel to the thickness direction of the substrate.

This allows the substrate to be held by the holder of the hand without the hand being inserted very deeply with respect to the substrate. In addition, this allows the hand to be prevented from being stirred by the movement of the arm. Therefore, the substrate can be held quickly.

Effects of the Invention

According to the present disclosure, a robot that efficiently transfers the substrate can be provided.

EMBODIMENT FOR CARRYING OUT THE INVENTION

Figure 1:
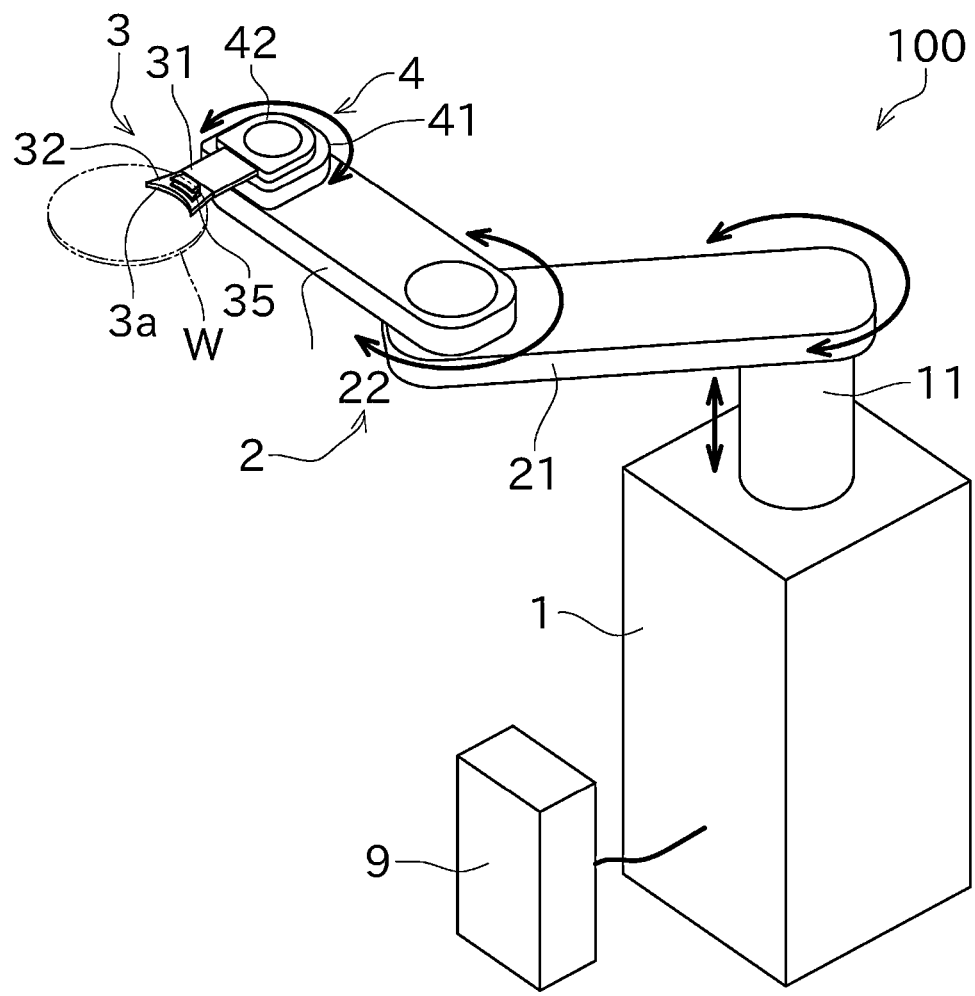
FIG. 1 is a perspective view showing an overall configuration of a robot according to one embodiment of the present disclosure.

The disclosed embodiments will be described below with reference to the drawings. FIG. 1 is a perspective view showing an overall configuration of a robot 100 according to one embodiment of the present disclosure.

The robot 100 shown in FIG. 1 is installed, for example, in a plant for the manufacture of a substrate W, such as a semiconductor wafer or a printed circuit board, or in a warehouse for storing the substrate W. The robot 100 is used to transfer the substrate W between two positions or more. The substrate W may be any of the following: a raw material for a substrate, a semi-finished product in process, or a finished product. The substrate W is disc-shaped in the present embodiment, but is not limited to this.

The robot 100 chiefly includes a base 1, a robot arm (an arm) 2, a robot hand (a hand) 3, a tilter 4, and a robot controller 9.

The base 1 is fixed to a floor of a factory or the like. Note, however, that the base 1 may also be fixed, for example, to suitable processing equipment. The base 1 may also be fixed to a member that can be moved horizontally.

As shown in FIG. 1, the robot arm 2 is installed to the base 1 with a lifting shaft 11 that can move in the vertical directions installed between them. The robot arm 2 can rotate with respect to the lifting shaft 11.

The robot arm 2 comprises a horizontal articulated robot arm. The robot arm 2 includes a first arm 21 and a second arm 22.

The first arm 21 is comprised of an elongated member extending in a horizontal direction. One end of the first arm 21 in the lengthwise direction is installed to the upper end of the lifting shaft 11. The first arm 21 is rotatably supported to rotate around the (vertical) axis of the lifting shaft 11. The second arm 22 is installed to the other end of the first arm 21 in the lengthwise direction.

The second arm 22 is comprised of an elongated member extending in a horizontal direction. One end of the second arm 22 in the lengthwise direction is installed to the distal end of the first arm 21. The second arm 22 is rotatably supported to rotate about an (vertical) axis parallel to the lifting shaft 11. The robot hand 3 is installed to the other end of the second arm 22 in the lengthwise direction.

Each of the lifting shaft 11, the first arm 21 and the second arm 22 is driven by a suitable actuator, not shown in the drawings. These actuators may be, for example, electric motors.

Arm joints are located between the lifting shaft 11 and the first arm 21, between the first arm 21 and the second arm 22, and between the second arm 22 and the robot hand 3. An encoder, not shown in the drawings, is installed at each arm joint and detects rotational position of each of the first arm 21, the second arm 22 and the robot hand 3. Also, at an appropriate location on the robot 100, an encoder that detects changes in the position of the first arm 21 in the height direction (i.e., an amount of lift of the lighting shaft 11) is installed.

Based on positional information of the first arm 21, the second arm 22, or the robot arm 3 including information about their rotational position or vertical position detected by the corresponding encoder, the robot controller 9 controls the operation of the electric motors that each drive one of the lifting shaft 11, the first arm 21, the second arm 22, and the robot hand 3.

The robot hand 3 is installed to the second arm 22 to project from the other end in the lengthwise direction (that is, the distal end) of the second arm 22. The robot hand 3 includes a wrist 31, a hand body 32 and a holder 35, as shown in FIG. 1. The wrist 31 is arranged at the proximal portion (the portion closer to the second arm 22) of the robot hand 3 and the hand body 32 is arranged at a portion of the robot hand 3 that includes a distal end (a projecting end) 3a.

The wrist 31 is attached to the distal end of the second arm 22 with a tilter 4 installed between them. The wrist 31 is rotatably supported to rotate about an (vertical) axis parallel to the lifting shaft 11. Note, however, that the axis of rotation of the wrist 31 can be tilted with respect to a line parallel to the lifting shaft 11 by using the tilter 4. The wrist 31 is rotationally driven by a suitable actuator that is not shown in the drawings. This actuator may be, for example, an electric motor.

The hand body 32 is connected to the distal end of the wrist 31. The hand body 32 is comprised of a plate-like member. The wrist 31 and the hand body 32 may be provided as one integrally formed member.

The holder 35 is a member that acts in order to hold the substrate W. The holder 35 is installed to the hand body 32. Since the holder 35 is installed to the hand body 32, it is positioned on a portion of the robot hand 3 that includes the distal end 3a. The holder 35 projects upward from the hand body 32.

The holder 35 is made of, for example, PP (Polypropylene), PEEK (poly ether ether ketone) and other resin. Note that, although only one holder 35 is installed to the hand body 32 in the present embodiment, there may be installed more than one holder 35.

The robot hand 3 is moved by the robot arm 2 or the like to an appropriated position in order to bring the holder 35 into contact with a portion of the substrate W including the edge and an area close to the edge. At this time, the robot hand 3 holds the substrate W with the holder 35. The configuration of the robot hand 3 for holding the substrate W will be described below.

The tilter 4 is installed to the distal portion of the second arm 22 (to the end portion opposite to the other end portion connected to the first arm 21).

Figure 2:
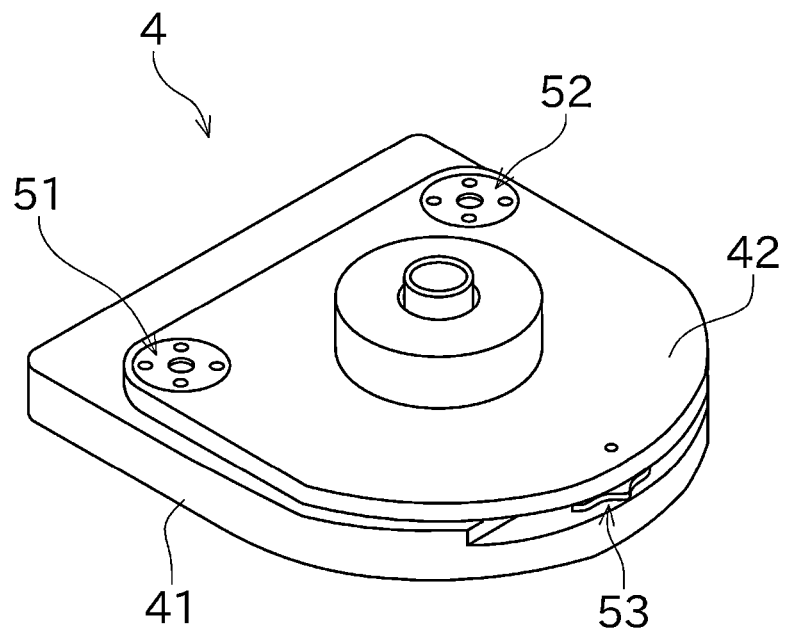
FIG. 2 is a perspective view showing an example of a tilter.

The tilter 4 includes a bottom plate 41 and the top plate 42 as shown in FIG. 2. The bottom plate 41 is fixed to the upper surface of the second arm 22. The top plate 42 rotatably supports the wrist 31 of the robot hand 3. A height adjuster 5 is located between the bottom plate 41 and the top plate 42. The tilter 4 adjusts the angle and direction of the tilt of the top plate 42 with respect to the bottom plate 41 by using this height adjuster 5.

Figure 3:
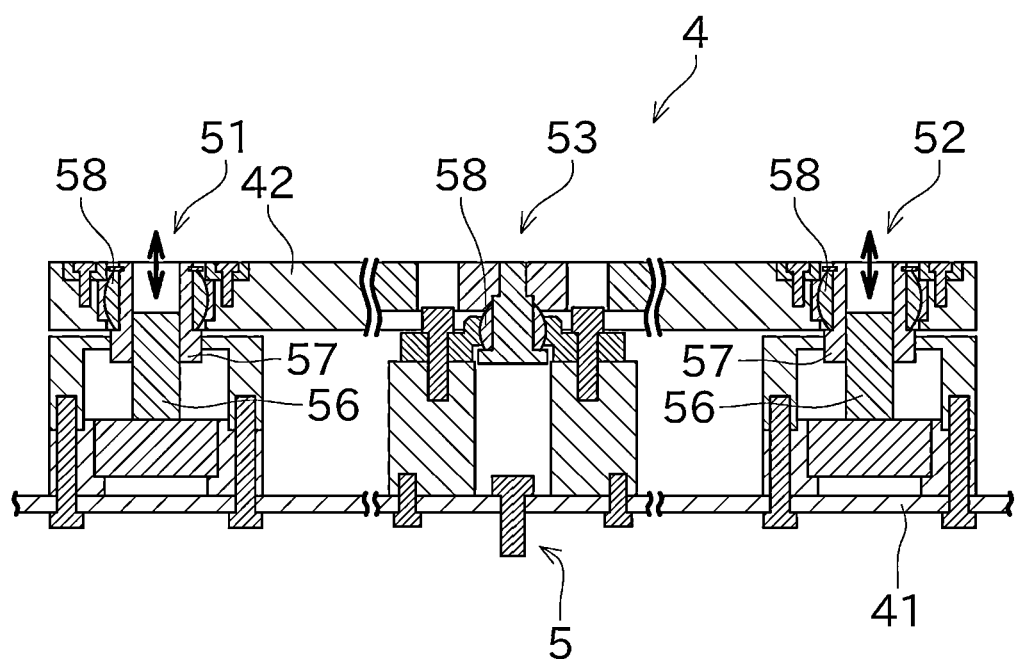
FIG. 3 is a cross-sectional view showing an example of a tilter.

The height adjuster 5 includes, for example, three supports 51, 52, 53 arranged at different positions between the bottom plate 41 and the top plate 42 as shown in FIG. 2. In FIG. 3, for convenience of explanation, the supports 51, 52 and 53 are drawn as they are positioned in a straight line, but in actuality, as shown in FIG. 2, they are arranged to form a triangle in a plan view.

Each of the supports 51 and 52 includes an externally threaded member 56, an internally threaded member 57, and a spherical bearing 58. The threaded shafts of the externally threaded members 56 are rotatably supported by the bottom plate 41 with their axes pointing in a vertical direction. Actuators (for example, electric motors), that are not shown in the drawings, can separately rotate each of these threaded shafts arranged in the two supports, 51 and 52. Each of the internally threaded members 57 is coupled with the threaded shaft of the corresponding externally threaded member 56. When the threaded shaft is rotated, the corresponding internally threaded member 57 moves in a vertical direction. This movement allows the height at which the supports 51 and 52 support the top plate 42 to be changed. The spherical bearings 58 are located between the internally threaded members 57 and the top plate 42.

A spherical bearing 58 is arranged at the support 53. The support 53 does not have such function to change the height of support by using threads.

With the actuators which are not shown in the drawings driven, the supports 51 and 52 independently change the height of the top plate 42 with respect to the bottom plate 41. In this manner, the angle and the direction of the tilt of the top plate 42 with respect to the bottom plate 41 are changed. As a result, the orientation (the angle and direction of the tilt) of the robot hand 3 with respect to the second arm 22 is adjusted. Note that, the configuration of the height adjuster 5 (and thus that of the tilter 4) is not limited to this configuration described above.

As shown in FIG. 1, the robot controller 9 is arranged separately from the base 1. Note, however, that the robot controller 9 may be arranged inside the base 1.

The robot controller 9 is configured as a known computer and includes a processing unit, such as a microcontroller, a CPU, a MPU, a PLC, a DSP, an ASIC or a PFGA, a memory unit, such as a ROM, a RAM or a HDD, and a communication unit that can communicate with an external apparatus. The memory unit stores a program to be executed by the processing unit, various thresholds, information about the holder 35, information about a storage apparatus 7, or the like. The communication unit is configured to receive the information about the substrate W or the like from the external apparatus.

The robot controller 9 control the lifting shaft 11, the robot arm 2, and the robot hand 3. For example, the robot controller 9 stores results of the detection made by the encoders corresponding to the orientation of the robot hand 3 as information about the orientation of the robot hand 3. In this manner, the robot controller 9 can replicate the orientation of the robot hand 3 as memorized by controlling the electric motors that dive elements of the robot 100 (such as the lifting shaft 11, the first arm 21, the second arm 22, and the robot hand 3) in order to match results of detection made by the encoders that detect an orientation of the robot hand 3 to the stored information about the orientation of the robot hand 3.

The robot controller 9 can also control the tilter 4. For example, when the robot hand 3 takes the substrate W out from the storage apparatus 7 and transfers it, the robot controller 9 can change the orientation of the robot hand 3 suitably by using the tilter 4, as described below, so that the robot hand 3 can hold the substrate W in the storage apparatus 7 with the holder 35.

Figure 4:
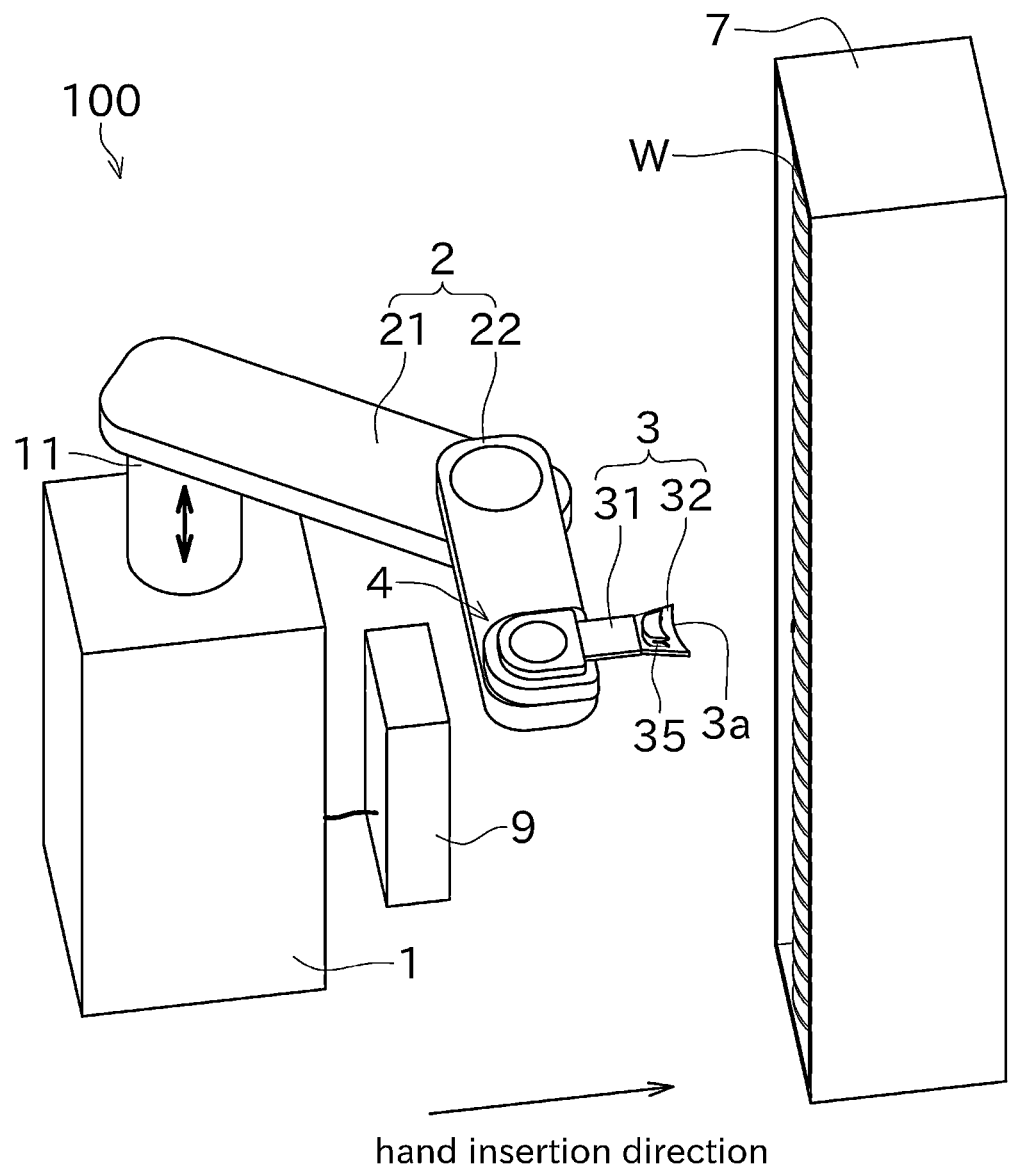
FIG. 4 is a drawing illustrating a robot obtaining an orientation of a substrate to be transferred.

As shown in FIG. 4, the storage apparatus 7 is used to store the substrate W. In the storage apparatus 7, a plurality of substrates W (for example, 100 or more substrates) are placed at regular intervals in the vertical direction (i.e., the heightwise direction of the storage apparatus 7) and stored. In the storage apparatus 7, the substrates W are usually stored in horizontal poses. The storage apparatus 7 is located at a predetermined distance from the robot 100.

The configuration of the robot hand 3 holding the substrate W will be described in detail below. Hereinafter, the direction in which the robot hand 3 sticks out from the distal end of the robot arm 2 (in other words, from the tilter 4) may be referred to simply as "the projection direction."

Figure 5:
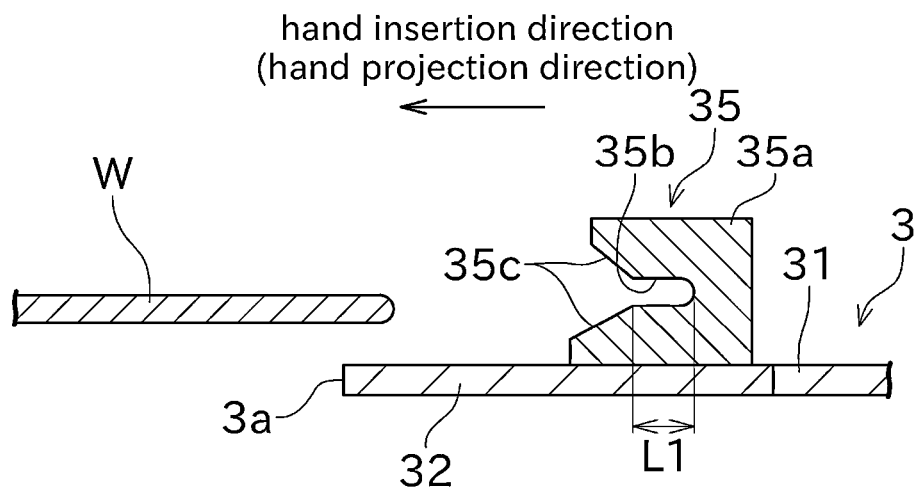
FIG. 5 is a cross-sectional view illustrating a substrate to be transferred and a robot hand at a time when the robot hand starts an operation of holding a substrate to take it out.
Figure 6:
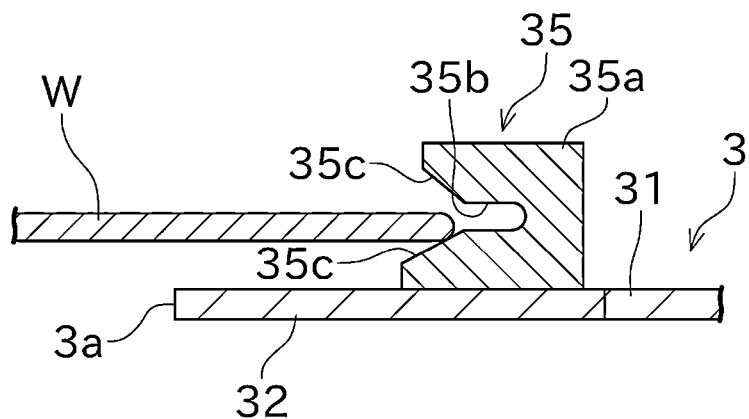
FIG. 6 is a drawing illustrating a substrate in contact with a guide portion of a holder.
Figure 7:
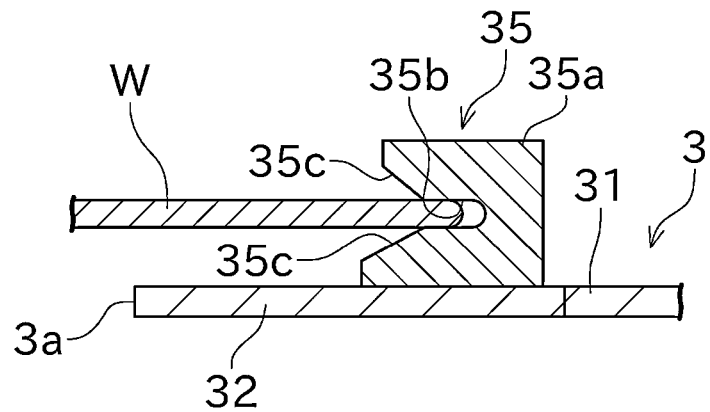
FIG. 7 is a drawing illustrating a substrate with its edge inserted into a groove in a holder.

As shown in FIG. 1, the robot hand 3 holds the substrate W with the holder 35. At this time, the substrate W is held over the top surface of the robot hand 3. The robot hand 3 transfers the substrate W keeping holding it. As shown in FIGS. 5 to 7, the holder 35 includes a holder body 35a and a groove 35b.

The holder body 35a is arranged on the top surface of the hand body 32. As shown in FIG. 1 and FIG. 4, with the orientation of the robot hand 3 horizontal, the holder body 35a is formed as an elongated block extending in the widthwise direction of the robot hand 3.

The groove 35b is formed on the furthest face of the holder body 35a from the tilter 4. The opening of the groove 35b is on the further side with respect to the tilter 4. With the orientation of the robot hand 3 horizontal, the groove 35b is formed as an elongated groove with respect to a horizontal direction and it horizontally goes through the holder body 35a. The groove 35b may be formed to be linear in a plan view or to follow an arc along the edge of the substrate W.

A portion of the edge of the substrate W can be fitted into the groove 35b. This allows the holder 35 to hold the substrate W.

When the orientation of the robot hand 3 is horizontal, the distance between the bottom surface and the top surface of the groove 35b is approximately equal to the thickness of the substrate W. Therefore, the groove 35b can contact both the top surface and the bottom surface of the substrate W. The length (depth) L1 of the groove 35b between the open end and the closed end that is measured when the holder body 35a is cut by a plane that divides the width of the robot hand 3 into equal halves as shown in FIG. 5 is predetermined so as to be suitable in size. This allows a portion of the edge of the substrate W to fit into the groove 35b and to be kept fitted.

A tapered guide section 35c is formed next to the open end of the groove 35b that is formed on the furthest face of the holder 35 from the distal end of the robot arm 2. The guide section 35c comprises two guide surfaces arranged to form a sideways-V-shape. One guide surface of the guide section 35c is located closer to the hand body 32 than the groove 35b, and the other is located further from the hand body 32 than the groove 35b. Therefore, the vertical distance between the surfaces of the guide section 35c becomes smaller as a point at which the distance is measured becomes closer to the tilter 4. One end of the guide section 35c that is closest to the tilter 4 is connected to the groove 35b.

With such a configuration, when the robot hand 3 takes out the substrate W to be transferred that is stored in the storage apparatus 7 from the storage apparatus 7 and transfers it, for example, the robot controller 9 controls elements such as the robot hand 3 based on the information stored in the memory unit.

That is, firstly, as shown in FIG. 5, with the robot hand 3 placed at a distance from the storage apparatus 7, the vertical position of the robot hand 3 is adjusted so that the vertical position of the robot hand 3 corresponds to the vertical position of the substrate W to be transferred. At this time, the orientation of the robot hand 3 is adjusted to be horizontal according to the orientation of the substrate W stored in the storage apparatus 7.

Next, a portion of the robot hand 3 that includes the distal end 3a is inserted into the storage apparatus 7, and as shown in FIG. 6, the guide section 35c of the holder 35 arranged on the robot hand 3 comes into contact with a portion of the edge of the substrate W located at the front side of the storage apparatus 7.

Then, the distal end 3a of the robot hand 3 is deeper inserted into the storage apparatus 7. Note that, however, the robot hand 3 does not need to be inserted into the interior of the storage apparatus 7 very deeply. As the robot hand 3 moves, the guide section 35c guides the portion of the edge of the substrate W into the groove 35b, and as shown in FIG. 7, the portion of the edge of the substrate W enters the groove 35b.

Figure 8:
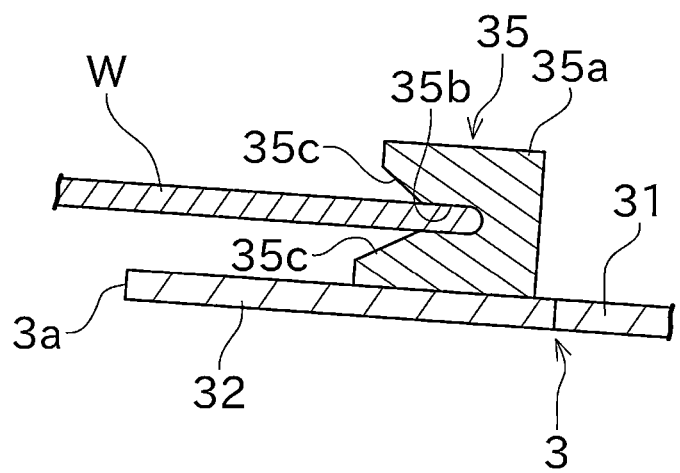
FIG. 8 is a cross-sectional view illustrating a robot hand tilted to hold a substrate.

After the insertion of the robot hand 3 into the storage apparatus 7 ended, the orientation of the robot hand 3 is tilted by the tilter 4. As shown in FIG. 8, the robot hand 3 is tilted so that its distal side including the distal end 3a (one side of the groove 35b including its open end) becomes higher than the proximal side (the deeper side of the groove 35b). As a result, a part of the weight exerted on the substrate W acts in such a direction that the substrate W is inserted deeply into the groove 35b. As a result of the robot hand 3 being tilted in this manner, the substrate W is held by the holder 35 (in other words, by the robot hand 3) being applied forces only to a certain portion of the substrate W (one of the two halves of the substrate W bisected).

If the substrate W is hypothetically divided by a centerline into two halves, one closer to the robot hand 3 and the other further from it, the holder 35 contacts only one half of the substrate W (the half closer to the robot hand 3) and force applied by the robot hand 3 is exerted through this contacting portion on the substrate W. In this manner, the full weight of the substrate W is supported by the robot hand 3. Therefore, this holding can be referred to as cantilevering holding. In this state, the robot hand 3 is taken out from the storage apparatus 7 and the substrate W is transferred.

The direction in which the robot hand 3 projects form the tilter 4 varies in a plan view. Note that, however, since the tilter 4 can three-dimensionally tilt the orientation of the robot hand 3, no matter which direction the robot hand 3 is facing in a plan view, it is possible to achieve the state shown in FIG. 8 in which the distal side of the robot hand 3 is higher than the other.

To release the substrate W held by the robot hand 3, the reverse operation of the above-described operation may be performed.

According to the configuration of the present embodiment, the hand body 32 can be smaller and its configuration can be simpler. Since the distance that the hand body 32 travel can be reduced, the hand body 32 can also be less stirred because of the travel. Therefore, the risk of the hand body 32 colliding with the substrate W or the like can be reduced. In addition, with the above-described configuration, the distance that the robot hand 3 travels toward the substrate W when the robot hand 3 holds and releases the substrate W can be shortened. Therefore, the substrate W can be efficiently transferred by using the robot hand 3.

As explained above, the robot 100 of the present embodiment is for transferring the substrate W. The robot 100 includes the robot arm 2, the robot hand 3, and the tilter 4. The robot arm 2 is movable. The robot hand 3 is installed to the robot arm 2 to project form it and holds and transfers the substrate W. The tilter 4 can tilt the orientation of the robot hand 3. The robot hand 3 comprises the holder 35. The holder 35 can contact the top surface and the bottom surface of the substrate W. With the tilter 4, the holder 35 holds the substrate W keeping in contact with the top surface and the bottom surface of the substrate W and applying forces to only one of the two halves of the substrate W bisected, as shown in FIG. 8.

Conventionally, when taking out a substrate from a storage apparatus with a robot hand, the robot hand has had to be inserted very deeply into the storage apparatus. However, the above-described configuration allows the substrate W to be cantileveredly held by the robot hand 3 without the robot hand 3 being moved very deeply inside the storage apparatus 7. In other words, the length of the robot hand 3 in the direction in which the robot hand 3 projects can be short and the degree to which the robot hand 3 should be inserted into the storage apparatus 7 when taking out the substrate W can be reduced. In addition, this allows the robot hand 3 to be prevented from being stirred by the movement of the robot arm 2. Therefore, the substrate W can be taken out quickly from the storage apparatus 7. As a result, the operation of taking out the substrate W can be efficiently performed.

In the robot 100 of the present embodiment, the holder 35 is arranged at the distal side of the robot hand 3.

This easily allows downsizing of the robot hand 3.

The robot 100 of the present embodiment also includes the tapered guide section 35c that contacts the edge of the substrate W when the robot hand 3 moves toward the substrate W.

This allows the robot hand 3 to hold the substrate W smoothly.

Next, a variation of the embodiment described above will be explained below. In the description of the present variation, the same or similar components as that of the above-described embodiment may be marked with the same references in the drawings and the description thereof may be omitted.

Figure 9:
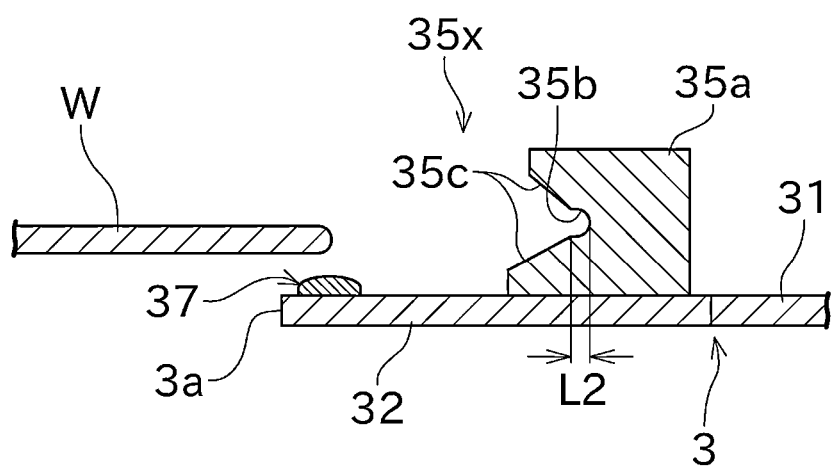
FIG. 9 is a cross-sectional view showing a variation of the embodiment described above.

In a robot hand 3 of the present variation, which is shown in FIG. 9, a holder 35x includes a holder body 35a and a supporter 37. A groove 35b formed in the holder body 35a is shallower than the groove 35b of the above-described embodiment. That is, the length L2 of the groove 35b in the depth direction (the hand projection direction) is shorter than the length L1 in the depth direction of the groove 35b of the above-described embodiment shown in FIG. 5.

The supporter 37 comprises a resilient member, such as a rubber, for example. The supporter 37 is arranged between the distal end 3a of the robot hand 3 and the holder 35x. The supporter 37 is arranged on the hand body 32 to project upwardly. The supporter 37 can contact the bottom surface of the edge of the substrate W.

Figure 10:
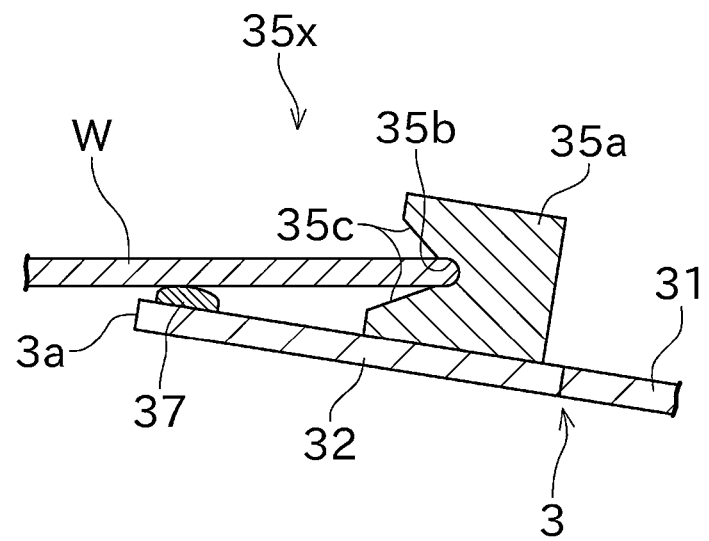
FIG. 10 is a drawing illustrating a robot hand of a variation tilted to hold a substrate.

In the present variation, with the robot hand 3 tilted as shown in FIG. 10, the top surface of the groove 35a of the holder body 35b contacts the top surface of the edge of the substrate W and the bottom surface of the edge of the substrate W is contacted mainly by the supporter 37. In this state, the substrate W can be cantileveredly held and transferred.

In this configuration, the supporter 37 supports the bottom surface of the substrate W at a point closer to the center of the substrate W than the holder body 35a. Therefore, the substrate W can be held stably in the state shown in FIG. 10. In addition, since the substrate W is shallowly inserted into the groove 35b, the substrate W held by the robot hand 3 can be easily released with the operation of the tilter 4.

As described above, in the robot 100 of the present variation, the holder 35x includes the supporter 37. The supporter 37 contacts the bottom surface of the substrate W at a point closer to the center of the substrate W than where the top surface of the groove 35b contacts the top surface of the substrate W.

This allows the substrate W to be held stably. In addition, whether the robot hand 3 holds or releases the substrate W can be switched easily by the operation of the tilter 4.

While the preferred embodiment and its variation of the present disclosure have been described above, the configurations explained above may be modified as follows, for example.

The robot hand 3 may be equipped with a plurality of the holders 35. The sizes of the holder 35 and the supporter 37 may be determined as desired according to the shape and/or size or the like of the substrate W.

Even when the groove 35b formed on the holder 35 is as deep as that in the embodiment described above, the robot hand 3 may be equipped with the supporter 37. In this case, as in the above-described variation, the robot hand 3 can transfer the substrate W while holding the substrate W using the holder 35 and the supporter 37.

The holder 35 with the configuration shown in FIG. 5 may be arranged on the bottom surface of the hand body 32 instead of the top surface.

The tapered guide section 35c may be arranged only on either the top side or the bottom side of the groove 35b. The guide section 35c may be omitted.

Figure 11:
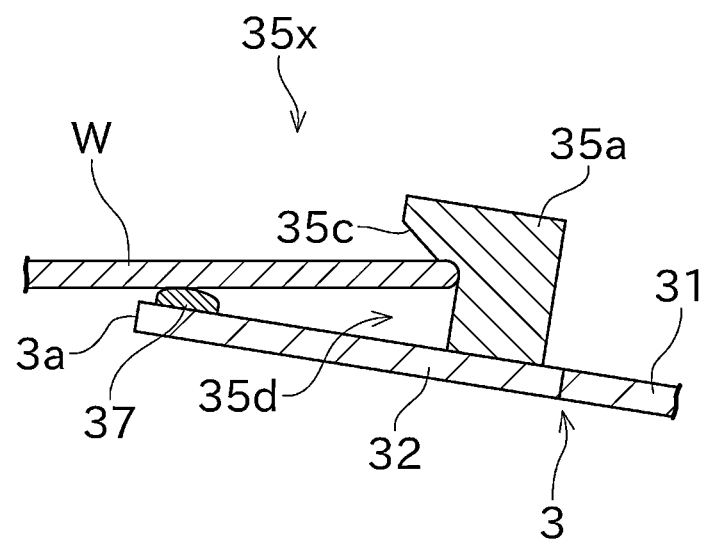
FIG. 11 is a cross-sectional view showing another variation.

As a variation, as shown in the FIG. 11, a wide recessed portion 35d may be formed in the holder body 35a instead of the groove 35b. In this case, the holder body 35a does not contact the bottom surface of the edge of the substrate W inserted into the recessed portion 35d.

The hand body 32 of the robot hand 3 may be integrally formed with the top plate 42 of the tilter 4.

The tilter 4 may be arranged between the base 1 and the lifting shaft 11, or between the lifting shaft 11 and the first arm 21, or between the first arm 21 and the second arm 22.

Figure 12:
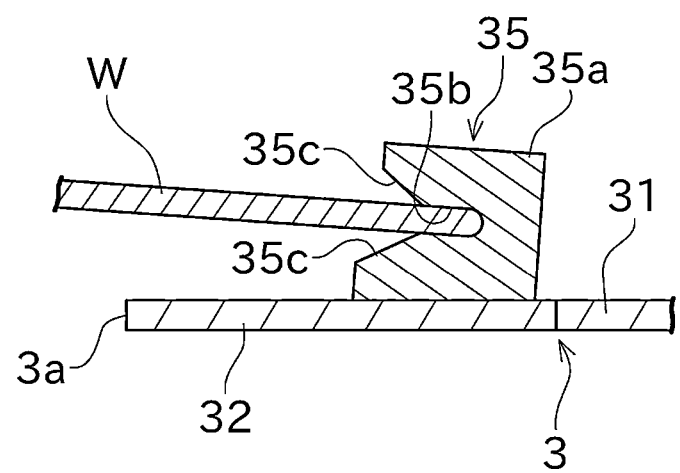
FIG. 12 is a cross-sectional view showing a variation wherein a robot hand holds a substrate, having a horizontal orientation.

The groove 35b of the holder 35 may be formed in such a way that the open end of the groove 35b faces obliquely upward when the orientation of the robot hand 3 is horizontal. In this case, as shown in FIG. 12, the substrate W can be cantileveredly held by the robot hand 3 that is in a horizontal state.

Figure 13:
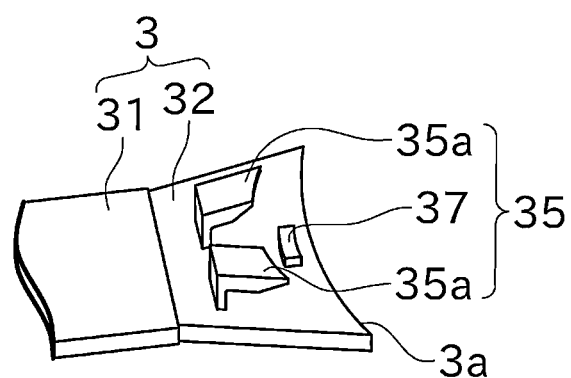
FIG. 13 is a perspective view showing a variation of arrangements of elements of a holder.

The robot hand 3 may be equipped with two holder bodies 35a shown in FIG. 11 placed apart from each other and the supporter 37 arranged on a position corresponding to the space between the two holder bodies 35a. An example of this variation is shown in FIG. 13. In the configuration shown in FIG. 13, the supporter 37 is arranged on the center of the hand body 32 in the width direction. The two holder bodies 35a are arranged symmetrically with respect to a center line that divides the width of the hand body 32. The two holder bodies 35a and the supporter 37 comprise the holder 35.

Figure 14:
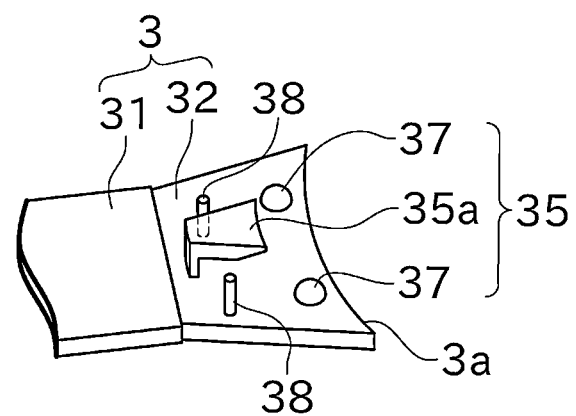
FIG. 14 is a perspective view showing another variation of arrangements of elements of a holder.

In the configuration shown in FIG. 13, two members (the holder bodies 35a) that contact the top surface of the substrate W and one member (the supporter 37) that contacts the bottom surface of the substrate W comprises the holder 35. Instead of this, the holder may be comprised of one member that contacts the top surface of the substrate W and two members that contact the bottom surface of the substrate W as shown in FIG. 14. In an example shown in FIG. 14, stoppers 38 are arranged on both sides of the hand body 32 with respect to a center line that divides the width of the hand body 32. These stoppers 38 can regulate the slip of the substrate W by contacting the edge of the substrate W when the robot hand 3 holds the substrate W. The stoppers 38 may also be applied to the configuration shown in FIG. 13, FIG. 4, or the like. The shape of the stoppers 38 may be determined as desired.

The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. The processor may be a programmed processor which executes a program stored in a memory. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

In view of the foregoing teachings, it is clear that the present disclosure may take many modified and variant forms. Therefore, it is to be understood that the present disclosure may be practiced in a manner other than that described herein, within the scope of the appended claims.

The invention claimed is:

1. A robot, comprising:
an arm that is movable;
a hand that is installed to the arm to project therefrom and configured to hold and transfer a substrate; and
a tilter configured to tilt an orientation of the hand, without the tilter changing an orientation of the arm, such that a distal portion of the hand is higher than a proximal portion of the hand,
wherein the hand includes a holder, and
wherein, with the tilter, the holder is configured to hold the substrate in contact with a top surface and a bottom surface of the substrate and apply a force to only one of two halves of the substrate bisected,
wherein the tilter comprises:
a top plate;
a bottom plate; and
a height adjuster between the top plate and the bottom plate,
wherein the height adjuster comprises exactly two sets of threaded elements which when twisted cause the hand to tilt.

2. The robot according to claim 1, wherein:
the holder is arranged at the distal portion of the hand.

3. The robot according to claim 1, wherein:
the holder includes a portion that is to contact the bottom surface of the substrate at a point closer to a center of the substrate than where another portion is to contact the top surface of the substrate.

4. The robot according to claim 1, further comprising:
a tapered guide section configured to contact an edge of the substrate when the hand is toward the substrate.

5. The robot according to claim 1, wherein:
the tilter is between the hand and the arm.

6. The robot according to claim 1, further comprising:
a wrist connected to the hand,
wherein the wrist is between the hand and the tilter, and the tilter is between the wrist and the arm.

7. The robot according to claim 6, wherein:
the wrist and the hand are integral.

8. A method of controlling a robot, comprising:
moving an arm of the robot, the arm having attached thereto a hand configured to hold and transfer a substrate;
inserting the hand into a storage of substrates;
tilting the hand while the hand is inserted into the storage such that a distal portion of the hand is higher than a proximal portion of the hand;
removing the hand which is holding a wafer from the storage while the distal portion of the hand is higher than the proximal portion of the hand.

9. The method according to claim 8, wherein:
due to a tilting of the hand, a part of the weight of the substrate urges the substrate in a direction to hold the substrate into a groove of the hand.

* * * * *